US008821701B2

(12) United States Patent
Higdon et al.

(10) Patent No.: US 8,821,701 B2
(45) Date of Patent: Sep. 2, 2014

(54) ION BEAM SPUTTER TARGET AND METHOD OF MANUFACTURE

(76) Inventors: Clifton Higdon, Birmingham, MI (US); Alaa A. Elmoursi, Troy, MI (US); Jason Goldsmith, Meadville, PA (US); Bruce Cook, Ankeny, IA (US); Peter Blau, Knoxville, TN (US); Qu Jun, Knoxville, TN (US); Robert Milner, Warren, MI (US)

( * ) Notice: Subject to any disclaimer, the term of this patent is extended or adjusted under 35 U.S.C. 154(b) by 192 days.

(21) Appl. No.: 12/792,324

(22) Filed: Jun. 2, 2010

(65) Prior Publication Data
US 2011/0297535 A1    Dec. 8, 2011

(51) Int. Cl.
C23C 14/00   (2006.01)
C25B 9/00    (2006.01)
C25B 11/00   (2006.01)
C25B 13/00   (2006.01)

(52) U.S. Cl.
USPC ................................. 204/298.12; 204/298.13

(58) Field of Classification Search
CPC ........... H01J 37/34; H01J 37/08; H01J 37/30; H01J 37/3429; H01J 37/3414; H01J 37/3491; H01J 37/3417; H01J 37/3426
USPC ........................................ 204/298.12, 298.13
See application file for complete search history.

(56) References Cited

U.S. PATENT DOCUMENTS

| 2,239,642 | A |   | 4/1941  | Burkhardt et al. |
| 2,251,510 | A |   | 8/1941  | Berghaus et al. |
| 3,250,694 | A |   | 5/1966  | Maissel et al. |
| 3,669,871 | A |   | 6/1972  | Elmgren et al. |
| 4,610,774 | A |   | 9/1986  | Sakata et al. |
| 4,871,434 | A |   | 10/1989 | Munz et al. |
| 4,915,810 | A |   | 4/1990  | Kestigian et al. |
| 4,988,422 | A |   | 1/1991  | Wirz |
| 5,000,834 | A |   | 3/1991  | Yoshikawa |
| 5,190,630 | A | * | 3/1993  | Kikuchi et al. ......... 204/192.12 |
| 5,234,560 | A |   | 8/1993  | Kadlec et al. |
| 5,318,840 | A |   | 6/1994  | Ikeda et al. |
| 5,466,355 | A | * | 11/1995 | Ohhashi et al. ......... 204/298.13 |
| 5,580,428 | A |   | 12/1996 | Krivokapic et al. |
| 5,922,176 | A | * | 7/1999  | Caskey ..................... 204/192.12 |
| 6,001,718 | A | * | 12/1999 | Katata et al. ................. 438/592 |
| 6,139,964 | A |   | 10/2000 | Sathrum et al. |
| 6,352,627 | B2|   | 3/2002  | Leyendecker et al. |
| 6,444,103 | B1|   | 9/2002  | Moslehi et al. |
| 6,589,453 | B1|   | 7/2003  | Saitoh et al. |
| 6,596,133 | B1|   | 7/2003  | Moslehi et al. |
| 6,797,338 | B2|   | 9/2004  | Saitoh et al. |

(Continued)

FOREIGN PATENT DOCUMENTS

JP         2001295038 A  * 10/2001

*Primary Examiner* — Michael Band
(74) *Attorney, Agent, or Firm* — Rader, Fishman & Grauer PLLC

(57) ABSTRACT

A target for use in an ion beam sputtering apparatus made of at least two target tiles where at least two of the target tiles are made of different chemical compositions and are mounted on a main tile and geometrically arranged on the main tile to yield a desired chemical composition on a sputtered substrate. In an alternate embodiment, the tiles are of varied thickness according to the desired chemical properties of the sputtered film. In yet another alternate embodiment, the target is comprised of plugs pressed in a green state which are disposed in cavities formed in a main tile also formed in a green state and the assembly can then be compacted and then sintered.

15 Claims, 3 Drawing Sheets

(56) References Cited

U.S. PATENT DOCUMENTS

| | | |
|---|---|---|
| 6,852,201 B2 | 2/2005 | Hermeler et al. |
| 6,869,334 B1 | 3/2005 | Leyendecker et al. |
| 7,017,382 B2 * | 3/2006 | Segal et al. .................... 72/256 |
| 7,270,891 B2 * | 9/2007 | Roth et al. .................... 428/640 |
| 7,550,066 B2 * | 6/2009 | Tepman .................. 204/192.12 |
| 8,039,096 B2 * | 10/2011 | Zhu et al. ...................... 428/220 |
| 2006/0006064 A1 * | 1/2006 | Tepman .................. 204/298.12 |

\* cited by examiner

ION BEAM SPUTTER TARGET AND METHOD OF MANUFACTURE

GRANT INFORMATION

The invention described herein was made in the course of research under Department of Energy Grant No. DE-FG36-06GO16054. The federal government may have certain rights in the invention.

TECHNICAL FIELD

A disclosed target for use in an ion beam sputtering apparatus is made of a plurality of tiles having at least two different chemical compositions. In an alternate embodiment, plugs of a first green state material are inserted into cavities formed in a target tile of a second green state material and then sintered to form a target.

BACKGROUND ART

In general, the ion beam sputtering process involves the use of a low energy plasma source in a magnetic field which develops a neutralized ion beam with the ion energy, direction and current density all independently controllable and all independent of the type of target used. The plasma is produced by direct current electron bombardment of a low pressure gas, typically inert, but which may have a small percentage of reactive gases.

Generally, any target material which can be physically placed in a vacuum chamber can be sputtered by this process. This includes powders and composite targets, as well as elemental materials. In depositing a film of a given chemical composition, where the target is relied on as the primary source of material, it is accepted practice to prepare the target from a given composition. The target source is commonly prepared by mixing the desired proportions of chemical reagents and pressing the powders together at either elevated or room temperature. However, where multi-component targets are utilized, such effects of ion bombardment as sputtering, formation of an altered surface layer, enhanced diffusion, surface texturing, compound formation and phase transformation may strongly influence the resultant film that is deposited on a substrate. Further, the film composition is not necessarily the same as the target composition due to differences in ion sputtering coefficients and film sticking coefficients.

The prior art has relied on making several iterations of target materials to achieve film depositions of desired chemical composition. This is an expensive and time consuming empirical procedure and has not been wholly satisfactory in use. An alternative approach to depositing multi-component films used in the prior art is to allow the ion beam to strike a segmented target.

It is known to use a multi material segmented target such as reported by P. Reinhardt et al., Thin Solid Films 51, 99 (1978) where the film composition was controlled by lateral positioning of the targets in the beam to sputter varying fractions of the two targets, thereby allowing the film resistivity to be varied over a range of magnitude. Limitations of this procedure are that elemental sputter yields in alloys or components and that the sputter yield ratios in alloys may be strongly composition dependent. Therefore, in prior art processes, thin film deposition using ion sputtering, the final film composition is difficult to predict.

In U.S. Pat. No. 4,915,810 to Kestigian et al. a solution to the above described process limitations is proposed where a target is comprised of a composite matrix of material to be deposited upon a substrate and the target includes a plurality of openings where each of the openings have a plurality of plugs of predetermined composition adapted for a press fit into corresponding openings in the target. The ions are made to collide against the target thereby liberating particles from the target into an inert low pressure gas in the chamber which are then deposited onto a substrate. The plugs may be arranged in a particular pattern and the target and plugs therein may be made of a pre-selected composition to yield the desired thin film coating over the substrate.

In U.S. Pat. No. 6,852,201 to Hermeler et al. it is taught to shape the top surface of the plugs in such a way that the sputtering rate for each metal used in the sputtering process can be selected to yield the desired composition of the layer being applied.

SUMMARY

The invention relates to a sputtering target for carrying out a Physical Vapor Deposition (PVD) coating process and more specifically, a PVD coating process where the sputtering target is sputtered by bombardment with gas atoms and/or ions and a layer consisting of a plurality of metallic elements is deposited on a substrate. The sputtering target is comprised of a plurality of target tiles made of a first chemical composition alternated in position with a plurality of target tiles made of a second chemical composition. In another embodiment, additional target tiles made of other chemical compositions can also be alternated in position with the first and second target tiles. In still another embodiment, tiles of a third chemical composition are stacked on top of the tiles made of the first or second chemical composition.

The geometries of the target tiles are of a generally rectangular shape and can be of individualized thickness as required to yield the desired chemical composition of the deposited film on the substrate. Also, the arrangement of the plurality of target tiles can be varied to yield the desired chemical composition of the deposited film on the substrate.

As a result of bombardment with gas ions, atoms from the tiled target plate are removed from the surface of the sputtering target as dust to enter the gas phase. The sputtered-off chemical atoms are separated from the gas phase and then deposited onto the surface of the substrate. In this way, the different types of atoms are applied to the substrate in a certain ratio, thus controlling the chemistry of the layer being applied.

The tiles of the materials used for the sputtering target can be of various materials and the tiles may be sized and varied in arrangement to yield the desired layer sputtered onto the substrate. According to the present teaching, the material $AlMgB_{14}$ or another boride material can be used to make the first target tiles and the material $TiB_2$ or another boride material can be used to make the second target tiles. These tiles are then arranged in position to yield the desired chemical composition of the deposited layer on the substrate.

The tiles can be made of a varied thickness to provide for the desired relative sputtering characteristics. In an alternative embodiment, the various tiles can be stacked one upon the other to provide for a varied chemical composition of the film as the sputtering process is carried out over time.

The present teaching provides for a sputtering target chemical composition and geometry that provides for a more effective PVD coating or other sputtering process.

In yet another alternate embodiment the plugs and the main tile are pressed in their green states prior to sintering. Then the plugs are assembled into the pockets formed in the main tile. Then the assembly can be pressed to ensure optimal compaction. The assembled tile would then be sintered to obtain a single tile with unique dual phase characteristics. It is also contemplated that three or more distinct materials could be used to form the final single tile for deposition or sputtering. This exemplary embodiment is fundamentally different from the teaching of the prior art in that a single article is produced by the final sintering step, whereas the prior art teaches the insertion of sintered plug prior to insertion into the main tile which compromises the integrity of the target.

DETAILED DESCRIPTION

Figure 1:
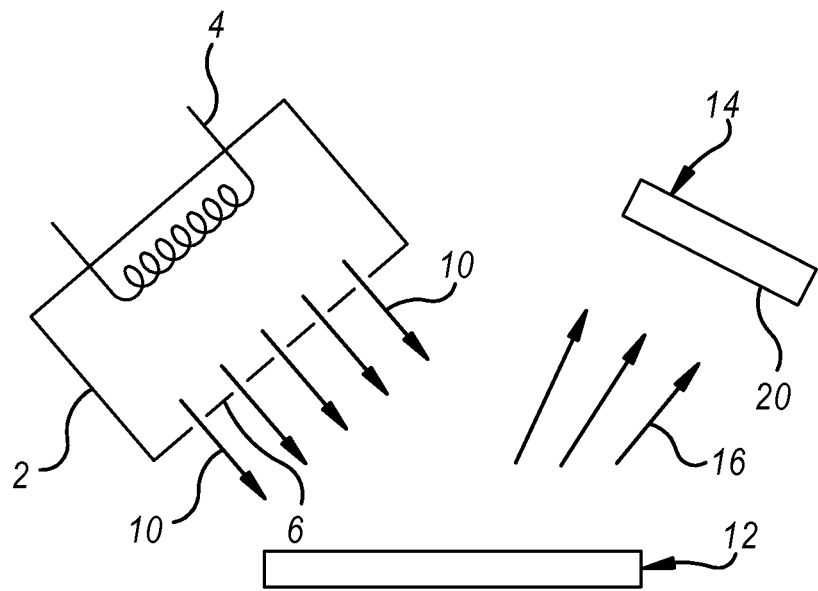
FIG. 1 is a schematic illustration of the essential portion of a prior art ion sputtering apparatus.

Referring now to the discussion that follows and also to the drawings, illustrative approaches to the disclosed systems and methods are shown in detail. Although the drawings represent some possible approaches, the drawings are not necessarily to scale and certain features may be exaggerated, removed, or partially sectioned to better illustrate and explain the present disclosure. Further, the descriptions set forth herein are not intended to be exhaustive or otherwise limit or restrict the claims to the precise forms and configurations shown in the drawings and disclosed in the following detailed description.

Moreover, a number of constants may be introduced in the discussion that follows. In some cases illustrative values of the constants are provided. In other cases, no specific values are given. The values of the constants will depend on characteristics of the associated hardware and the interrelationship of such characteristics with one another as well as environmental conditions and the operational conditions associated with the disclosed system.

Now referring to the drawings and particularly to FIG. 1. a schematic illustration of the essential portions of a prior art ion sputtering apparatus is shown. A direct current is applied to ion gun 2 which is equipped with extraction guides 4. The chamber of ion gun 2 is filled with an inert gas such as nitrogen. When the ion gun 2 is energized with a direct current in coil 4, it produces an ion beam 10 which is aimed at and impinges on the target 12. Target 12 is shown as a solid disc made of a chemical composition that produces a desired thin film 20 to be deposited on the substrate 14 when the materials of the target 12 are sputtered into the inert gas by the ion beam 10 and land on the substrate 14. Target 12 is shown as a solid homogenous disc made of a desired composition that produces a sputtered material that is to be deposited upon the substrate 14 in the form of a thin film 20. Sputtered material 16 from the target 12 is angularly deflected and impinges on the surface 20 of the substrate 14; there it is deposited in the form of a thin film 20. The rate of deposition and exact composition of the film 20 depends on a variety of factors but primarily on the characteristics of the ion beam 10 and the target 12.

It will be appreciated by one skilled in the art that although FIG. 1 shows a sputtering apparatus 2 in which portions having no direct relationship with the present invention are omitted and an actual sputtering apparatus will include various known means to actually produce sputtering such as means for introducing the working gas into the chamber of ion gun, means for evacuating the vacuum chamber and other various elements. Considerable design analysis and experimentation is required to effectuate a suitable sputtering apparatus 2 and to obtain the desired chemical composition and thickness of the deposited film 20 on the substrate 14.

Figure 2:
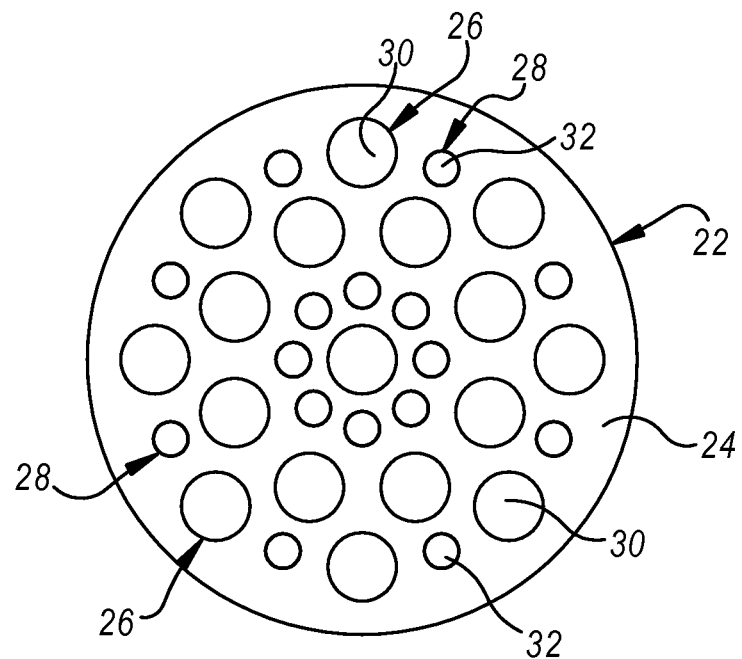
FIG. 2 is a perspective view of a prior art sputtering target.

Now referring to FIG. 2 of the drawings, a plan view of a prior art target 22 is shown. In an effort to modify the chemical composition of the deposited film an altered configuration can be attempted such as that shown in FIG. 2 where such a configuration is disclosed in U.S. Pat. No. 4,915,810. A plurality of holes 26, 28 is drilled into the altered target disc 24 to no more than one half of the altered target disc 24 thickness. The holes 26, 28 can be arranged in a pattern which may consist solely of relatively small diameter holes 28, large diameter holes 26 or sequentially alternating large diameter and small diameter holes 26, 28.

Plugs 30, 32 with a different composition from the target disc 24 are fitted into some or all of the holes 26, 28 as required yielding a desired film composition on the substrate 14 after sputtering. Holes not filled with plugs do not cause concern as they emit the same composition as the bulk target material. This target 22 works because a homogenous chemical film composition results from a non-homogenous target composition, if the proper mixing of the sputtered target materials occurs in the deposition process.

Plugs 30, 32 are designed and prepared following well known chemistry procedures. Chemicals are dried, carefully weighed and intimately mixed. After a precalcination at the required elevated temperature under suitable environmental gaseous conditions, plugs of the desired dimensions to produce a press fit in the target holes are formed by sintering in a press. Another high temperature calcination may be necessary.

The number and composition of the plugs 30, 32 may be varied according to the desired composition of the film deposited by sputtering on the substrate 14. Alterations in the target 22 (and consequently the deposited film) chemical composition may be altered by the addition or removal of plugs 30, 32. Alterations may also be effectuated by the substitution of plugs 30, 32 of varied chemical compositions. In this manner the chemical composition of the thin film 20 deposited on the substrate 14 can be regulated.

Figure 3:
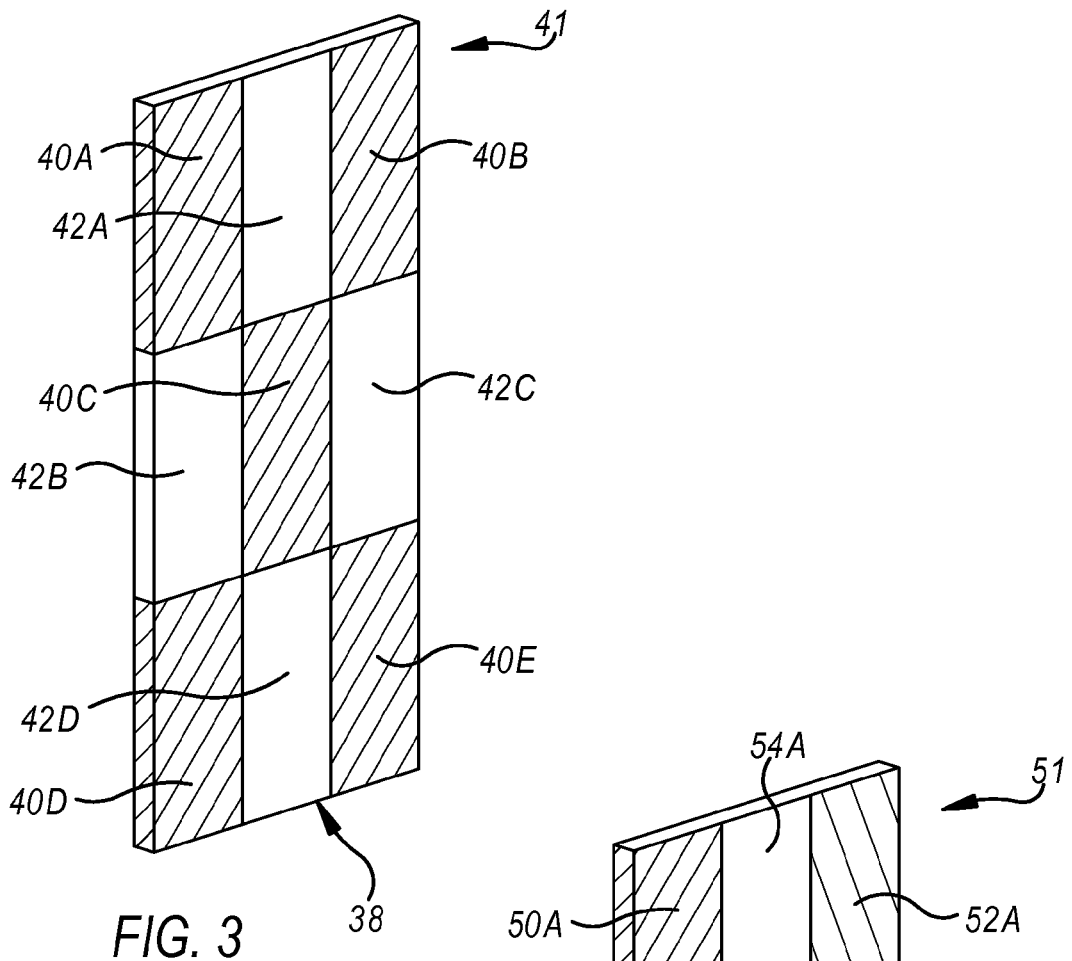
FIG. 3 is a perspective view of the present sputtering target made of first and second target tiles.

Now referring to FIG. 3 of the drawings, a perspective view of an exemplary target is shown. In the shown embodiment, the target 38 is made up of a plurality of target tiles 41 which includes individual target tiles 40A, 40B, 40C, 40D, 40E, 42A, 42B, 42C, 42D where tiles 40A-40E are made of a first chemical composition and where tiles 42A-42D are made of a second chemical composition. The chemical compositions of the target tiles 40A-40E and target tiles 42A-42D are chosen to yield the desired chemical composition of the thin film layer 20 deposited on the substrate 14 by the sputtering process.

FIG. 3 shows the arrangement of the target tiles 40A-40E as alternating with the target tiles 42A-42D but various arrangements can be used to produce a desired sputtering result. As only one example, the target tiles 40A-40E can be made of a chemical composition such as $AlMgB_{14}$ and target tiles 42A-42D can be made of a chemical composition such as $TiB_2$ or visa versa. Any appropriate boride or dual phase ceramic material can be used for the target tiles. The tiles can be brazed onto a copper backing plate (not shown). Many other materials may be used for these target tiles and various known processing methods may be used to yield the desired chemical characteristics for the sputtering process. Deviations from the disclosed compounds are contemplated and covered in this disclosure including various materials and processing methods.

The ratio of the length to width of the target tiles 41 can be varied either for all of the target tiles 41 or on an individual tile basis to change the composition of the deposited film. Also, the shape and roughness of the outer surface (face) of the individual tiles 40A-40E and 42A-42D can be shaped to regulate the rate of material release when it is struck by the ion beam 10.

Figure 4:
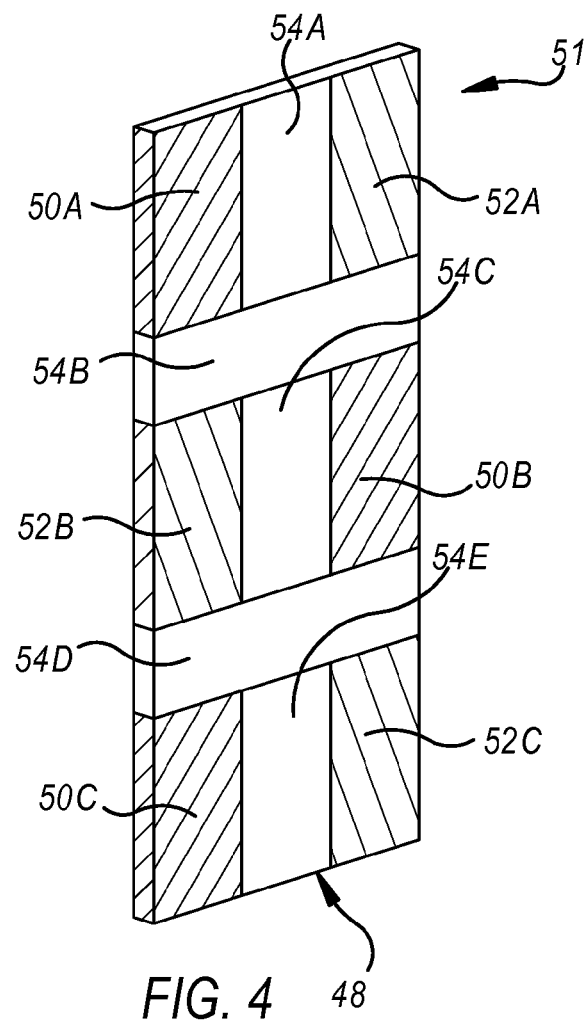
FIG. 4. is a perspective view of an alternate embodiment of the present sputtering target made of first, second and third target tiles.

Now referring to FIG. 4 of the drawings, a perspective view of an alternate embodiment of the exemplary sputtering target is shown. In this embodiment, three different chemical compositions are used to make the sputtering target tiles 51. Target tiles 50A-50C are made of a first chemical composition and target tiles 52A-52C are made of a second chemical composition and target tiles 54A-54E are made of a third chemical composition. One arrangement of the target tiles 51 is shown in FIG. 4 but the particular arrangement is one of many arrangements that may be used to yield the desired deposited thin film 20. Only three different target tile compositions are shown in FIG. 4 but it is contemplated that several compositions can be used along with various arrangements of the target tiles 51.

Figure 5:
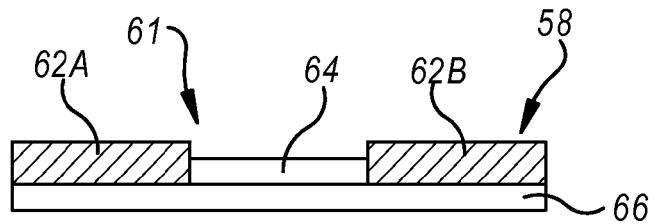
FIG. 5 is a cross-sectional view of an alternate embodiment of the present sputtering target having varied thickness target tiles.

Now referring to FIG. 5 of the drawings, a cross-sectional end view of an alternate embodiment of the exemplary sputtering target 58 is shown where the target tiles 61 are of varying thickness. Target tiles 62A and 62B are shown as being of a first thickness while the target tile 64 is shown as being of a second thickness. The target tiles 62A, 62B and 64 are shown bonded to a backing plate 66. The effect is that the rate of sputtering and transfer of the tile material from the target 58 into the gas of the PVD chamber can be changed by selecting the material and thickness of particular target tiles. Thus, the relative position of the target tiles 61 would be of varied thickness and thus be positioned of varied distance from the ion gun 2 as compared to planar tile arrangements such as shown in FIGS. 3 and 4.

Figure 6:
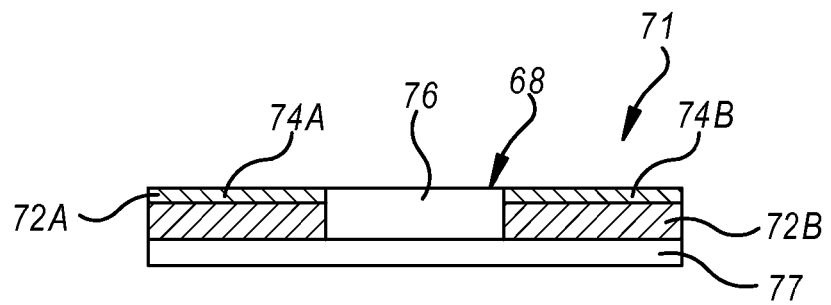
FIG. 6 is a cross-sectional view of an alternate embodiment of the present sputtering target having stacked target tiles.

Now referring to FIG. 6 of the drawings, a cross-sectional view of an alternate embodiment of the exemplary sputtering target 68 is shown where at least two of the target tiles are arranged in a stacked configuration. Shown in FIG. 6 is target tile 76 and base target tiles 72A and 72B which are covered by stacked tiles 74A and 74B respectively. The chemical composition of the stacked tiles 74A, 74B is different from the chemical composition of the base tiles 72A, 72B. The target tiles 71 are shown as being bonded by a process such as brazing to a support plate 77 which can be made of a material such as copper. The thickness and chemical composition of both the base tiles 72A, 72B and that of the stacked tiles 74A, 74B are selected to generate a desired chemical composition of the deposited thin film 20 where a first thin film is deposited during the initial period of the sputtering process and a second thin film having a different chemical composition is deposited over the first thin film layer.

Figure 7:
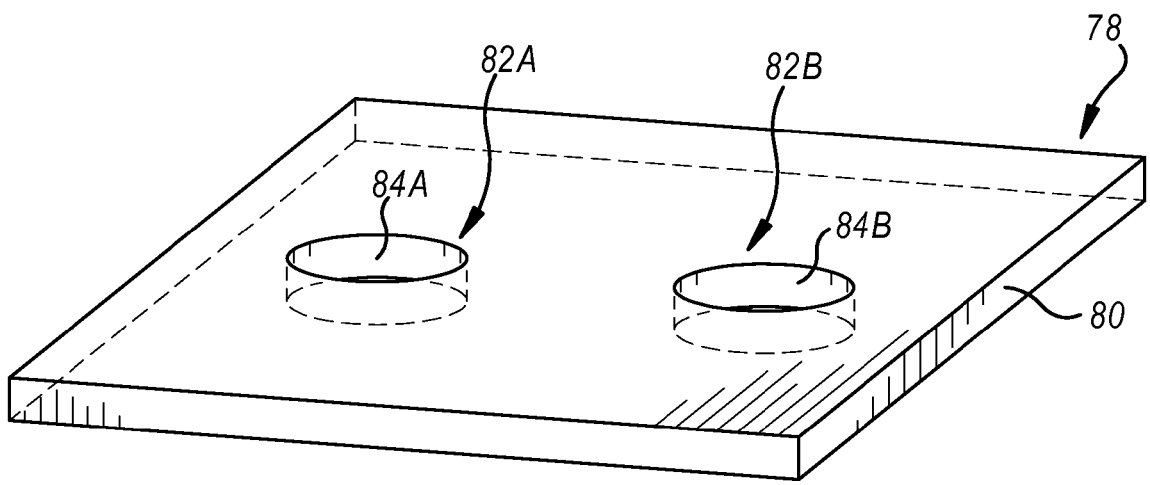
FIG. 7 is a perspective view of an alternate embodiment of the present sputtering target manufactured using the exemplary process.

Now referring to FIG. 7 of the drawings, a perspective view of a sputtering target 78 which is manufactured using the exemplary process is shown. For this example, cavities 82A and 82B are formed into the surface of the main target tile 80.

At the appropriate time, which is discussed in detail in the following description, plugs 84A and 84B are inserted into the cavities 82A and 82B. The following description uses two example materials but there is a wide range of materials that may be used for the plugs 84A, 84B and the main target tile 80. Recognizing that the following configuration is described using example materials, which can be selected by the user and can vary over a significant range of both materials and exact processing steps, plugs 84A and 84B can be made of AlMgB14 while the main target tile 80 can be made of TiB2, although many other materials may be substituted for these materials such as similar boride compositions or any suitable dual phase ceramic material. According to the exemplary manufacturing process, the main target tile 80 and the plugs 84A and 84B are pressed in their green states without prior hot pressing or sintering. The main target tile 80 is pressed with the cavities 82A, 82B removed out of the matrix to accommodate the AlMgB14 phase of the plugs 84A, 84B respectively. The cavities would be positioned on the surface of the main target tile 80 so as to not compromise the integrity of the main target tile 80 during the subsequent sintering or sputtering processes.

The number, size and depth of the cavities and their associated plugs would be selected such that the total volume of the plug material within the main tile material matrix would remain at approximately the level required to achieve an even distribution by weight between the main target tile and plug phases during the sputtering process. For example, when using the TiB2 material for the main target tile and AlMgB14 for the plugs, the total volume of AlMgB14 within the TiB2 matrix would remain at approximately 30% to 65% so as to achieve the even distribution by weight.

Some example dimensions for a typical target would be a main target tile 80 having a thickness of 8 mm, a width of 50 mm and a length of 80 mm.

According to the exemplary manufacturing process, once the individual materials for the main target tile 80 and the plugs 84A, 84B are pressed in their green state to optimal compaction they would be assembled into a single target 78 configuration. One definition of optimal compaction is that handling each individual phase will not cause the phase to fall apart. Once assembled into one target 78 assembly, the target 78 could be pressed as one piece just to ensure optimal compaction between the discrete materials.

The target in the green state would then be placed into a sintering furnace at about 1500 to 1600 degrees C. to obtain a single target 78e with structural integrity and having unique dual phase material characteristics. This target 78 tile could then be brazed onto a copper backing plate (not shown) and made ready for vapor deposition and sputtering. This exemplary embodiment is fundamentally different from the teaching of the prior art in that a single article is produced by the final sintering step, whereas the prior art teaches sintering the plugs prior to insertion into the target tile. When hard materials such as borides are used, the prior art process results in material cracking and other instabilities.

The present disclosure has been particularly shown and described with reference to the foregoing illustrations, which are merely illustrative of the best modes for carrying out the disclosure. It should be understood by those skilled in the art that various alternatives to the illustrations of the disclosure described herein may be employed in practicing the disclosure without departing from the spirit and scope of the disclosure as defined in the following claims. It is intended that the following claims define the scope of the disclosure and that the method and apparatus within the scope of these claims and their equivalents be covered thereby. This description of the disclosure should be understood to include all novel and non-obvious combinations of elements described herein, and claims may be presented in this or a later application to any novel and non-obvious combination of these elements. Moreover, the foregoing illustrations are illustrative, and no single feature or element is essential to all possible combinations that may be claimed in this or a later application.

What is claimed is:

1. A target for a Physical Vapor Deposition process comprising:
   a first target tile made of a first chemical composition defining a length, width, and substantially equal thickness throughout, and a second target tile made of a second chemical composition defining a length, width, and substantially equal thickness throughout, wherein said first target tile is positioned adjacent relative to at least one of the length and width of said second target tile and wherein said first target tile is thicker than said second target tile; and
   a backing for supporting said first target tile and said second target tile.

2. The target of claim 1, wherein said first target tile is made of $TiB_2$.

3. The target of claim 1, wherein said second target tile is made of $AlMgB_{14}$.

4. The target of claim 1, wherein said first target tile is made of a boride material.

5. The target of claim 1, wherein said second target tile is made of a dual phase ceramic material.

6. The target of claim 1, further comprising a third target tile made of a third chemical composition defining a length, width, and thickness, said third target tile positioned adjacent to either said first target tile or said second target tile.

7. A target for a Physical Vapor Deposition process comprising: a first target tile made of a first chemical composition defining a length, width, and substantially equal thickness throughout, a second target tile made of a second chemical composition defining a length, width, and substantially equal thickness throughout positioned adjacent relative to at least one of the length and width of said first target tile, and a third target tile made of a third chemical composition defining a length, width, and substantially equal thickness throughout positioned on top of said second target tile in a thickness direction, wherein said first target tile is thicker than said second target tile; and
   a backing for supporting said first target tile and said second target tile.

8. The target of claim 1, comprised of a plurality of first target tiles and a plurality of second target tiles, wherein the plurality of first target tiles is positioned to alternate adjacently relative to at least one of the length and width with respect to the plurality of second target tiles.

9. A target for a Physical Vapor Deposition process comprising:
   one or more first target tiles defining a length, width, and substantially equal thickness throughout made of a first chemical composition comprising $TiB_2$ and one or more second target tiles defining a length, width, and substantially equal thickness throughout made of a second chemical composition comprising $AlMgB_{14}$, wherein at least one of the first target tiles is positioned adjacent relative to at least one of the length and width of at least one of the second target tiles and wherein at least one first target tile is thicker than at least one second target tile; and
   a backing for supporting at least one of the first target tiles and at least one of the second target tiles.

10. The target of claim 9, comprised of a plurality of first target tiles and a plurality of second target tiles, wherein the plurality of first target tiles is positioned to alternate adjacently relative to at least one of the length and width with respect to the plurality of second target tiles.

11. The target of claim 9, further comprising one or more third target tiles made of a third chemical composition, at least one of the third target tiles positioned adjacent to at least one first target tile or one second target tile.

12. The target of claim 9, further comprising at least one third target tile positioned on top of at least one second target tile in a thickness direction, wherein the at least one third target tile has a chemical composition different from the chemical composition of the at least one second target tile.

13. A target for a Physical Vapor Deposition process comprising:
   an arrangement of target tiles including a plurality of first target tiles defining a length, width and substantially uniform thickness throughout made of a first chemical composition, a plurality of second target tiles defining a length, width and substantially equal thickness throughout made of a second chemical composition, and a plurality of third target tiles defining a length, width and substantially equal thickness throughout made of a third chemical composition, wherein each of the plurality of third target tiles are positioned on top of the plurality of second target tiles in a thickness direction, wherein the plurality of first target tiles and the plurality of third target tiles each include an exposed surface in the thickness direction, the exposed surface of the plurality of first target tiles being arranged coplanar with the exposed surface of the plurality of third target tiles; and
   a backing for supporting at least the plurality of first target tiles and the plurality of second target tiles.

14. The target of claim 1, wherein the length and width of the first target tile varies from the length and width of the second target tile.

15. The target of claim 7, wherein the first target tile and the third target tile each include an exposed outer surface in the thickness direction.

* * * * *